United States Patent
Yeh et al.

(10) Patent No.: US 6,543,087 B2
(45) Date of Patent: Apr. 8, 2003

(54) MICRO-ELECTROMECHANICAL HINGED FLAP STRUCTURE

(75) Inventors: J. Andrew Yeh, Pleasant Hill, CA (US); Tom A. Kwa, San Jose, CA (US); Robertus Petrus Van Kampen, Fremont, CA (US)

(73) Assignee: AIP Networks, Inc., Fremont, CA (US)

( * ) Notice: Subject to any disclaimer, the term of this patent is extended or adjusted under 35 U.S.C. 154(b) by 106 days.

(21) Appl. No.: 09/872,074

(22) Filed: Jun. 1, 2001

(65) Prior Publication Data
US 2002/0180311 A1 Dec. 5, 2002

(51) Int. Cl.[7] ............................. E05D 11/10; E05F 1/08
(52) U.S. Cl. ............................. 16/292; 16/321; 16/324; 16/333; 16/335; 16/343; 310/328; 310/326
(58) Field of Search .................. 16/292, 321, 326–328, 16/319, 324, 333, 343, 335, 297, 308, 82, 85, 86 B; 292/95, 109, 116, 121, 102, 107, 108; 108/1, 2, 4, 9, 10; 310/328, 326

(56) References Cited

U.S. PATENT DOCUMENTS

| | | | | |
|---|---|---|---|---|
| 87,469 A | * | 3/1869 | Collamer ................. | 16/335 |
| 1,697,652 A | * | 1/1929 | Jackson .................. | 16/324 |
| 2,857,618 A | * | 10/1958 | Jordan ................... | 16/335 |
| 2,984,858 A | * | 5/1961 | Westerfors ............... | 16/343 |
| 3,336,075 A | * | 8/1967 | Wilson ................... | 16/324 |
| 3,887,997 A | | 6/1975 | Hartleroad et al. | |
| 4,783,850 A | | 11/1988 | MacDonald et al. | |
| 4,802,951 A | | 2/1989 | Clark et al. | |
| 4,990,462 A | | 2/1991 | Sliwa, Jr. | |
| 5,021,736 A | | 6/1991 | Gonsalves et al. | |
| 5,025,346 A | | 6/1991 | Tang et al. | |
| 5,349,855 A | | 9/1994 | Bernstein et al. | |
| 5,621,829 A | | 4/1997 | Ford | |
| 5,642,015 A | | 6/1997 | Whitehead et al. | |

(List continued on next page.)

FOREIGN PATENT DOCUMENTS

| | | |
|---|---|---|
| EP | 1 099 970 A2 | 5/2001 |
| EP | 1 102 096 A2 | 5/2001 |
| EP | 1 120 677 A2 | 8/2001 |

OTHER PUBLICATIONS

Akiyama et al., "Scratch Drive Actuator with Mechanical Links for Self–Assembly of Three–Dimensional MEMS", *J. of Microelectromech. Systems*, 6(1):10–17 (1997).

Comtois and Bright, "Surface Micromachined Polysilicon Thermal Actuator Arrays and Applications", *Solid–State Sensor and Actuator Workshop*, Hilton Head, South Carolina, Jun. 2–6, 1996.

Ebefors et al., "New Small Radius Joints Based on Thermal Shrinkage of Polyimide in V–Grooves for Robust Self–Assembly 3D Microstructures", *J. Micromech. Microeng.*, 8:188–194 (1998).

(List continued on next page.)

*Primary Examiner*—Chuck Y. Mah
(74) *Attorney, Agent, or Firm*—Pennie & Edmonds LLP

(57) ABSTRACT

The micro-electromechanical hinged flap system includes a substantially horizontal substrate and a main flap hinged on one side thereof to the substrate. The system also includes at least one locking flap, preferably two, for securing the main flap in a substantially vertical position. The locking flap is coupled to the substrate by means of a biasing mechanism that continually forces the locking flap toward a position parallel to the substrate. Also provided is a method for assembling a micro-electromechanical hinged flap system. A locking flap is rotated through an acute angle against a biasing force. The biasing force is caused by a biasing mechanism coupling the locking flap to a substrate. A main flap is then raised, whereafter the locking flap is released, such that the biasing force causes the locking flap to engage with the main flap, thereby, securing the main flap in position at the predetermined angle.

26 Claims, 10 Drawing Sheets

U.S. PATENT DOCUMENTS

| | | | |
|---|---|---|---|
| 5,710,846 | A | 1/1998 | Wayman et al. |
| 5,903,686 | A | 5/1999 | MacDonald |
| 5,912,094 | A | 6/1999 | Aksyuk et al. |
| 5,922,214 | A | 7/1999 | Liu et al. |
| 5,960,133 | A | 9/1999 | Tomlinson |
| 5,997,958 | A | 12/1999 | Sato et al. |
| 5,998,906 | A | 12/1999 | Jerman et al. |
| 6,005,994 | A | 12/1999 | MacDonald et al. |
| 6,044,185 | A | 3/2000 | MacDonald |
| 6,075,239 | A | 6/2000 | Aksyuk et al. |
| 6,094,293 | A | 7/2000 | Yokoyama et al. |
| 6,097,859 | A | 8/2000 | Solgaard et al. |
| 6,101,299 | A | 8/2000 | Laor |
| 6,101,371 | A | 8/2000 | Barber et al. |
| 6,128,122 | A | 10/2000 | Drake et al. |
| 6,128,818 | A | 10/2000 | Baldwin |
| 6,134,207 | A | 10/2000 | Jerman et al. |
| 6,134,357 | A | 10/2000 | MacDonald |
| 6,154,586 | A | 11/2000 | MacDonald et al. |
| 6,166,478 | A | 12/2000 | Yi et al. |
| 6,175,443 | B1 | 1/2001 | Aksyuk et al. |

OTHER PUBLICATIONS

Fan et al., "Self–Assembled Microactuated XYZ Stages for Optical Scanning and Alignment", Reprinted with permission from *Transducers '97, International Conference on Solid–State Sensors and Actuators*, 1:319–322 (1997), ©1997 *IEEE*, pp. 424–427.

Fukuta et al., Microactuated Self–Assembling of 3D Polysilicon Structures with Reshaping Technology, 5 pages.

Garcia, "Micro–Flex Mirror and Instability Actuation Technique", 6 pages.

Harsh et al., "Solder Self–Assembly for MEMS", 7 pages.

Judy and Muller, "Magnetically Actuated, Addressable Microstructures", *J. of Microelectromech. Systems*, 6(3):249–256 (1997).

Lin et al., "Angular–Precision Enhancement in Free–Space Micromachined Optical Switches", *IEEE Photonics Technology Letters*, 11(10):1253–1255 (1999).

Lin et al., "Micro–Machined Three–Dimensional Micro–Optics for Integrated Free–Space Optical System", *IEEE Photonics Technology Letters*, 6(12):1445–1447 (1994).

Liu et al., "Surface Micromachined Magnetic Actuators", 6 pages.

Reid et al., "Automated Assembly of Flip–Up Micromirrors", *Transducers '97*, 1997 International Conference on Solid–State Sensors and Actuators, Chicago, Jun. 16–19, 1997.

Shimoyama et al., "3D Micro–Structures Folded by Lorentz Force", 5 pages.

Smela et al., "Controlled Folding of Micrometer–Size Structures", *Science*, 268:1735–1738 (1995).

Smela et al., "Self–Opening and Closing Boxes and Other Micromachined Folding Structures", *Transducers '95—Eurosensors IX*, The 8$^{th}$ International Conference on Solid–State Sensors and Actuators, and Eurosensors IX, Stockholm, Sweden, Jun. 25–29, 1995.

Syms, "Surface Tension Powered Self–Assembly of 3–D Micro–Optomechanical Structures", *J. of Microelectromech. Systems*, 8(4):448–455 (1999).

Syms and Yeatman, "Self–Assembly of Three–Dimensional Microstructures Using Rotation by Surface Tension Forces", *Electronics Letters*, 29(8):662–664 (1993).

Tien et al., "Surface–Micromachined Mirrors for Laser–Beam Positioning", *Transducers '95—Eurosensors IX*, The 8$^{th}$ International Conference on Solid–State Sensors and Actuators, and Eurosensors IX, Stockholm, Sweden, Jun. 25–29, 1995.

Yi and liu, "Magnetic Actuation of Hinged Microstructures", *IEEE J. of Microelectromech. Systems*, 8(1):10–17 (1999).

Ataka, Manabu; *Fabrication and Operation of Polyimide Bimorph Actuators For A Ciliary Motion System*; Journal Of Microelectromechanical Systems, vol. 2 (4), 1993.

Hoffmann, Martin; *Bistable Mircomechanical Fiber–Optic Switches On Silicon With Thermal Actuators*; Sensors and Actuators V78, 1999, pp28–35.

Judy, Jack W.; *Magnetic Microactuation Of Polysilicon Felxure Structures*; Journal Of Microelectromechanical Systems V4(4), Dec. 1995, pp162–169.

Lin et al.; *Free–Space Micromachined Optical Switches For Optical Networking*; IEE Journal of Selected Topics In Quantum Electronics, vol. 5 (1); Jan./Feb. 1999; 6 pages.

Lin et al.; *On The Expandability Of Free Space Micromachined Optical Cross Connects*; Journal Of Lightwave Technology vol. 18 (4); Apr. 2000; pp482–489.

Lin et al.; *Micro–Machined Three–Dimensional Mircro–Optics For Integrated Free–Space Optical System*; IEEE Photonics Technology Letters, vol. 6, No. 12 Dec. 1994, pp1445–1447.

MacDonald, R.I; *Large Optical Switches*; SPIE vol. 3749; Aug. 1999; pp 28–29.

Moustaffa et al.; *Calibration Method For Optical Switching*; US Application No.: 09/944,352; Filed Aug. 30, 2001; pp 1–6.

Neilson et al., "*Fully Provisioned 112x112 Micro–Mechanical Optical Crossconnect With 35.8Tb/s Demonstrated Capacity,*" Bell Labs, Lucent Technologies, 791 Holmdel–Keyport Rd, Holmdel, NJ 07733; 202/PD12–1 pp 1–3.

Okayama et al., *Two–Module Stage Optical Switch Network*; Journal Of Lightwave Technology; vol. 18 (4); Apr. 2000; pp 469–476.

http://www.ensc.sfu.ca/people/faculty/parameswaran/personal/devices/; Scissor Hinge Diagram; date accessed Dec. 28 2001; p. 1–8.

http://bsac.eecs.berkeley.edu/~yeh/sem–mechanism.html; Microhinge Mechanism; date accessed Dec. 28, 2001; p. 1–3.

http://www.ece.cmu.edu/~mems/projects/memsyn/ressyn/index.shtml; Microresonator Synthesis Module; date accessed Dec. 28 2001; pp 1–2.

http://www.ee.ualberta.ca/mm/combcloseup.html; Close up of a Comb Drive; date accessed: Dec. 28, 2001; p. 1–2.

http://bsac.eecs.berkeley.edu/~yeh/sem–mechanism.html; Microhinge Diagram; date accessed: Dec. 28, 2001; p. 2–3.

\* cited by examiner

MICRO-ELECTROMECHANICAL HINGED FLAP STRUCTURE

TECHNICAL FIELD

The invention relates generally to micro-electromechanical systems (MEMS) or micro-optical-electromechanical systems (MOEMS). More particularly, the invention is directed to a micro-electromechanical hinged flap structure.

BACKGROUND OF THE INVENTION

MEMS and MOEMS systems (hereafter "MEMS") combine electronics with micro scale mechanical devices, resulting in microscopic machinery, such as sensors, valves, gears, mirrors, and actuators embedded in semiconductor chips. The MEMS manufacturing process is similar to that used in the semiconductor industry, wherein silicon wafers are patterned via photolithography and etched in batch processes.

Most MEMS devices are limited to two-dimensional (hereafter "2D") structures; that is, structures that appear in two dimensions, typically in a horizontal plane, with limited extension to a third dimension, typically a vertical plane. However, three-dimensional (hereafter "3D") MEMS structures may be desirable for some applications, particularly in optical systems on a chip where 3D micro-optical components are needed. Examples of 3D micro-optical components include laser collimators, tunable lasers, tunable filters, beam steering reflectors, corner cube reflectors, and tunable Fabry-Perot etalons. Assembly processes have, therefore, been developed to construct 3D microstructures from 2D shapes formed using basic MEMS manufacturing technology.

In general, such assembly methods are performed on devices either serially, i.e., assembling one component at a time, or in parallel, i.e., assembling multiple components simultaneously. 3D assembly may also occur once or multiple times during manufacture, as well as singly or in a batch process. Batch assembly is typically preferred since it retains the economic efficiencies inherent in batch MEMS fabrication techniques.

Furthermore, the assembly process may be manual, such as by placing a vertical component directly onto a horizontal substrate, or automated where a 3D structure is self-assembled with minimal human intervention. Manual assembly is generally restricted to the research and development environment, since it is a time-consuming and low-yield procedure, whereas automated assembly is generally reserved for a high-yield manufacturing environment. Automated self-assembly is suitable for batch assembly in a manufacturing environment, particularly for on-chip systems that have a high density of 3D structures, which are to be assembled in parallel. An example of such a 3D automated assembly process is disclosed in U.S. Pat. No. 6,166,478 to Yi et al. (hereafter "Yi"), which is incorporated herein by reference.

Likewise, automated self-assembly of 3D MEMS structures can be performed by powered or powerless assembly processes. Powered assembly forms 3D structures by consuming external energy in such forms as electrostatic force (see Bibliography 1), magnetic force (see Bibliography 2), Lorentz force (see Bibliography 3), thermal bimorph (see Bibliography 4), and fuel that powers a microengine (see Bibliography 5). Powerless assembly assembles the 3D structures by applying a specific material to the structures and inducing deformation or surface tension of the specific material. Common materials used for the powerless process include solder[6], polymer[7], etc. Examples of the abovementioned powered and powerless assembly processes can be found in the references listed in the bibliography section below.

In addition, both hinged and hingeless structures are able to be self-assembled to form 3D structures. An example of a hinged structure can be seen in Yi, which teaches a method for assembly of MEMS systems using magnetic actuation. FIGS. 1A and 1B are isometric views of prior art MEMS systems 100 and 120 shown and described in the Yi patent. Yi teaches a MEMS system that includes at least two hinged flaps, namely a primary flap 102 or 122, and a secondary flap 104 or 124. Each flap includes a different amount of Permalloy or other magnetic material 106 or 126 affixed thereto. Furthermore, the flaps are hinged to a substrate at hinges 108 and 110, or 130 and 132. The flaps are hinged at an angle to each other, and are rotated out of the plane of the wafer substrate when placed in a magnetic field of sufficient strength. When placed in an increasing magnetic field, the flaps are raised asynchronously, at different times, due to the different amounts of Permalloy used in the flaps. As they are raised, the flaps interact with each other and become interlocked, as shown in FIGS. 1A and 1B.

Due to the nature of MEMS manufacturing, shafts of any hinge 108 and 110, or 130 and 132 are typically square or rectangular in cross-section; see FIG. 6. This necessitates creating large clearance spaces within the hinge to allow the shaft to rotate. Each shaft is attached to, or forms part of, each rotatable flap. However, these large clearance spaces lead to flaps that are unstable and that can shift in their hinges in both X 112 and Y 114 directions. This dramatically affects the hinge tolerances, thereby negatively affecting the tolerance of the primary flap with respect to the vertical. In typical applications, it is desirable that the primary flap be as close to vertical as possible, such as within 0.03 degrees. However, with the above described system, if a secondary flap shifts as little as 3–5 micrometer longitudinally within its hinge, and the distance between where the secondary flap is connected to the primary flap and the secondary flap's hinge is 300 micrometer away (vertically), the angular error of the primary flap to the vertical can be as much as arctan(4/300)=0.76 degrees.

Moreover, once assembled, the secondary flaps 104 or 124 interlock with the primary flap 106 or 122 to hold the primary flap in an assembled position. The secondary flaps 104 or 129 are, however, substantially free to rotate away from the primary flap 106 or 122 and, thereby, release the primary flap from their interlocked position. The only way the primary flap is held in position is by the use of scissor hinges, which use a cantilevered staple to exert a retaining force on the primary flap. A detailed description of scissor hinges can be found below in relation to FIG. 6. The scissor hinges, however, do not provide enough force on their own to secure the primary flap in position, hence the use of the secondary flaps. Furthermore, scissor hinges alone cannot ensure that the primary flap is vertical enough. The vertical angle of the primary flap is basically constrained by the etched edge of the primary flap and the etched surface of the substrate. In addition, the scissor hinge only secures the bottom of primary flap. Air damping or shock may push the primary flap back to the horizontal plane.

Moreover, the secondary flaps are only held in position by friction forces between the secondary flaps and the primary flap. This leads to an untenable position where should the system undergo a shock, such as by being bumped, the secondary flaps will rotate away from the primary flap, allowing the primary flap to rotate out of its vertical position, thereby destroying the 3D structure. Therefore, the system disclosed in Yi does not provide a suitable solution for securing secondary flaps into an accurately controlled position in a 3-D MEMS structure.

In light of the above, a need exists for a 3-D MEMS structure that includes a system of flaps that can be assembled through automated self assembly, while permanently and accurately maintaining the positions or angles of the flaps.

SUMMARY OF THE INVENTION

To address the drawbacks associated with the prior art, a micro-electromechanical hinged flap system is provided. The micro-electromechanical hinged flap system includes a substantially horizontal substrate and a main flap hinged on one side thereof to the substrate. The system also includes at least one locking flap, preferably two, for securing the main flap in a substantially vertical position. The locking flap is coupled to the substrate by means of a biasing mechanism that continually forces the locking flap toward a position parallel to the substrate. The biasing mechanism is preferably a torsion bar or a bending mode spring, i.e., a mechanical spring, such as a cantilevered arm. The main flap is preferably hinged to the substrate along a hinge axis that is substantially perpendicular to a rotational axis of the locking flap.

Also provided is a method for assembling a micro-electromechanical hinged flap system. The method starts with an unassembled and relaxed 2D system that mechanically responds to an external source, such as a magnetic field or a change in temperature. A locking flap is rotated through an acute angle against a biasing force. The biasing force is caused by a biasing mechanism coupling the locking flap to a substrate. A main flap is then raised, whereafter the locking flap is released, such that the biasing force causes the locking flap to engage with the main flap, thereby securing the main flap in position at the predetermined angle.

Externally applied forces induce torque forces on the main and locking flaps, rotating all the flaps to the desired positions and angles. This self-assembly process can be used in batch assembly or individual assembly for 3D microstructures on a chip or wafer. Once the systems are assembled by this process, they can sustain their positions or angles permanently, or they can be disassembled to their original 2D form.

The biasing force of each locking flap applies equal and opposite biasing forces to opposite sides of the main flap, preventing lateral motion of the main flap. Also, once fully engaged, alignment guides on each locking flap prevent lateral motion of the main flap. Therefore, locking flaps together with a hinge coupling the main flap to the substrate, substantially increase the stability of the main flap in the 3D structure.

BRIEF DESCRIPTION OF THE DRAWINGS

For a better understanding of the nature and objects of the invention, reference should be made to the following detailed description, taken in conjunction with the accompanying drawings, in which.

Like reference numerals refer to corresponding parts throughout the several views of the drawings.

DETAILED DESCRIPTION OF THE PREFERRED EMBODIMENTS

For ease of explanation, a set of common axes will be used throughout this description. In addition, any reference to "horizontal" refers to a plane substantially parallel with a substrate 202 (FIG. 2), while any reference to "vertical" refers to a plane substantially perpendicular to the substrate. Furthermore, the embodiments described below are preferably MEMS structures etched from a silicon wafer, but alternatively may be any micromechanical system. By MEMS it is meant any structure that is etched in a wafer and freed by the undercutting of structures, structures created from deposited thin films and freed by removing sacrificial layers, or any combination of the aforementioned. The MEMS structures can be made using any publically available processes, such as those practiced by Sandia National Laboratories, or Microelectronics Center of North Carolina (MCNC).

Figure 2:
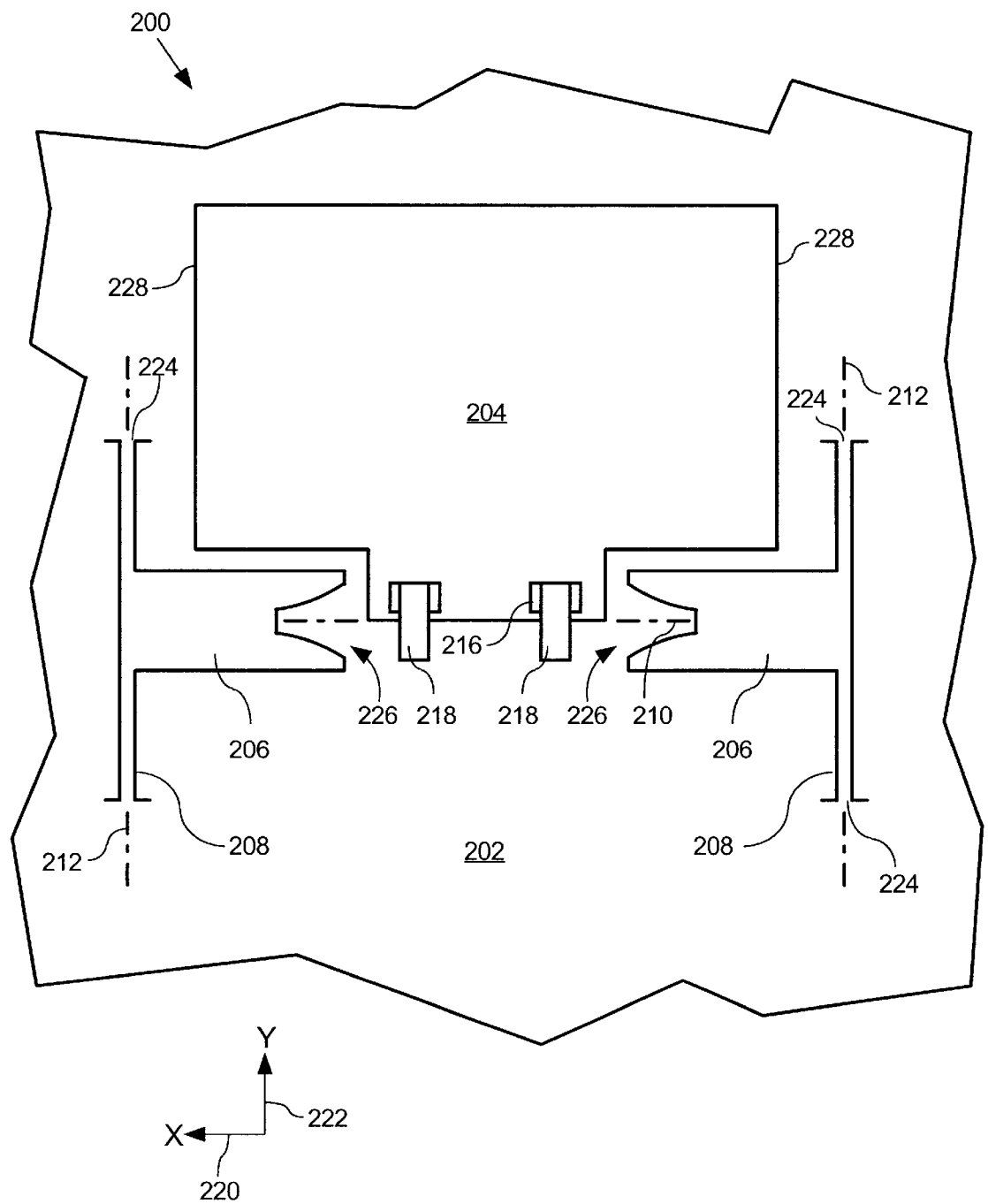
FIG. 2 is a top view of an unassembled micro-electromechanical hinged flap system according to an embodiment of the invention.

FIG. 2 is a top view of an unassembled micro-electromechanical hinged flap system 200 according to an embodiment of the invention. A main flap 204 is preferably hinged, by at least one hinge 218, to a substrate 202. The substrate 202 is preferably the upper surface of a silicon wafer. Unassembled, the substrate 202 is substantially co-planer with a horizontal plane formed along a X–Y plane (220 and 222). The hinges 218 are preferably spring-loaded structures, such as scissor hinges, described in further detail below in relation to FIG. 6, but may alternatively be any type of suitable hinge. Preferably, the hinges 218 essentially consist of a spring loaded mechanism passing through an opening 216 near one edge of the main flap 204, which allows the main flap to rotate about a hinge axis 210.

Figure 1A:
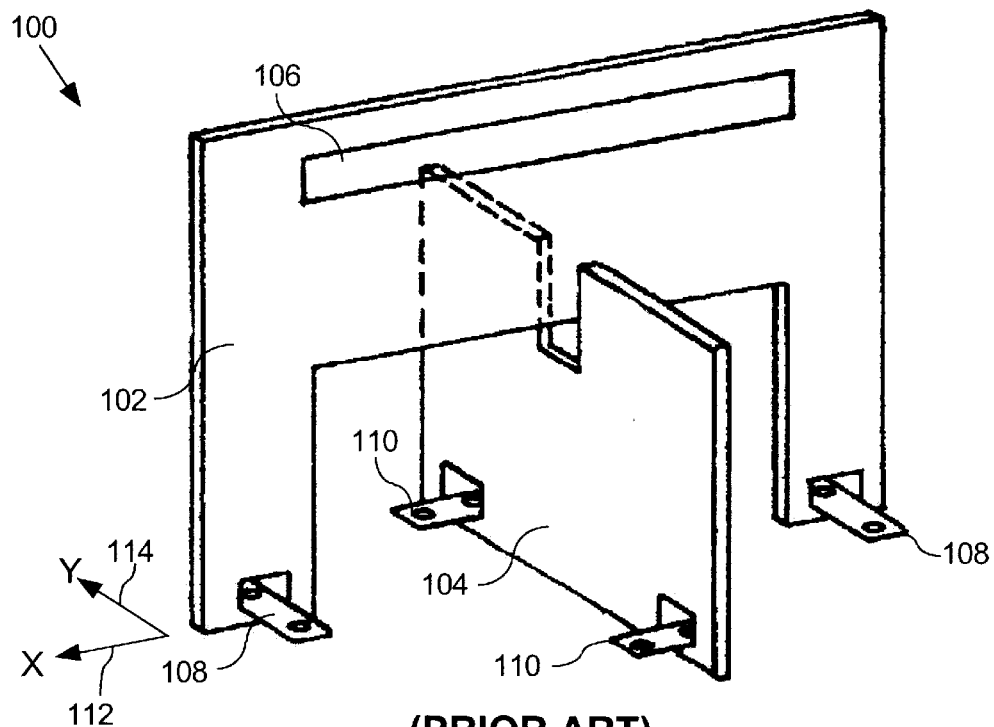
FIG. 1A is an isometric view of a first prior art flap system.
Figure 1B:
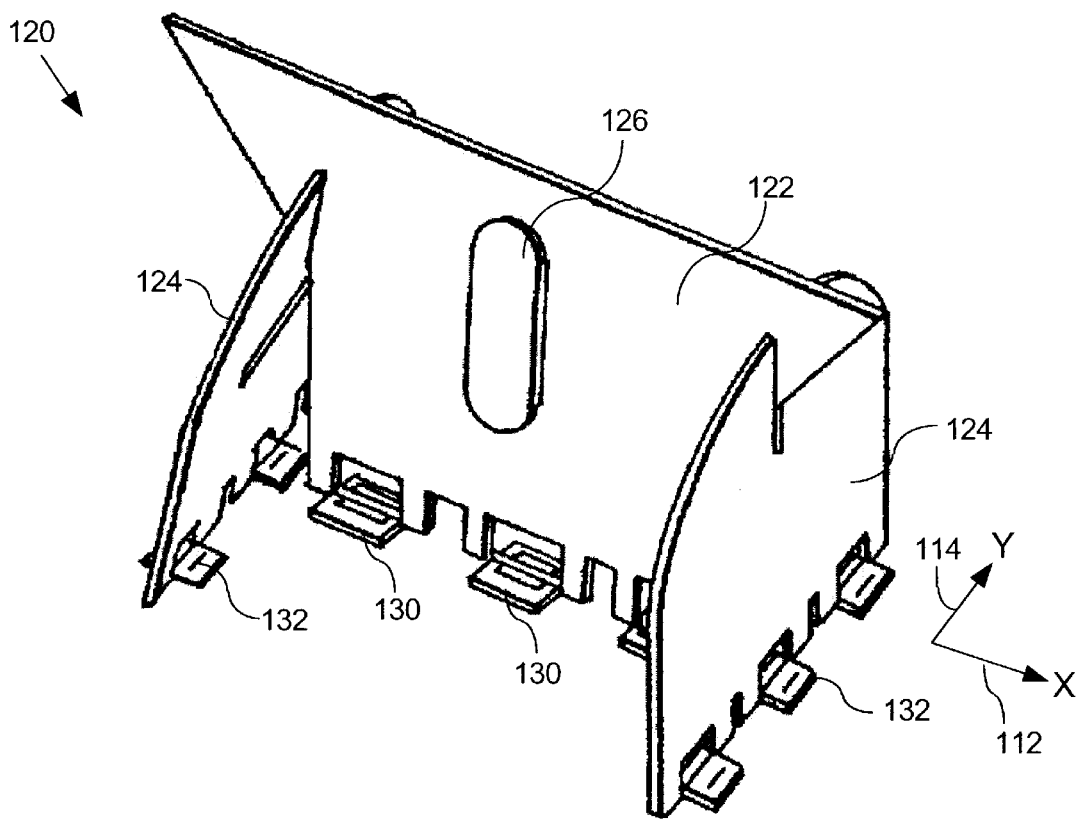
FIG. 1B is an isometric view of a second prior art flap system.

The unassembled micro-electromechanical hinged flap system 200 also includes at least one, preferably two, locking flaps 206. Each locking flap is rotatable about a locking flap axis 212, which in the preferred embodiment is perpendicular to the hinge axis 210. The locking flaps 206 are coupled to the substrate 202 by means of a biasing mechanism 208. The biasing mechanism 208 continually forces the locking flap 206 toward a position parallel to said substrate 202, i.e., towards the locking flaps assembled horizontal position. In a preferred embodiment, the biasing mechanism 208 is a torsion bar, which is a rod or bar that resists twisting and has a strong tendency to return to its original position when twisted. The torsion bar, therefore, restores and provides a spring force to the locking flap to bias the flap into its relaxed and unassembled position shown in FIG. 1. The torsion bar is preferably coupled to the substrate 202 at its distal ends 224, thereby reducing any shifting of the locking flaps within their hinges. By applying a torque force opposite to that of the biasing force, the locking flaps 206 may be rotated out of a horizontal plane, i.e., parallel to the substrate. On release of the applied torque force the locking flap 206 will tend to return to its relaxed and unassembled position, shown in FIG. 2.

Moreover, the main flap 204 is preferably shaped to allow the unassembled locking flaps to be disposed on a side of the main flap 204 that is hinged to said substrate. Therefore, the main flap's shape can generally be described as "T" shaped.

The main flap 204 and the locking flaps 206 may also include tabs thereon. The tabs interact with external sources, such as a magnetic field, electric field, or temperature, which are used to assemble the 3D structure, as described in further detail below in relation to FIGS. 3A–3F. In a preferred embodiment, the tabs are made from a ferrous metal, such as a permalloy or memory alloy. Alternatively, the tabs may themselves generate a non-contact force, including but not limited to a magnetic force, electrostatic force, or a Lorentz force. A force generated between a flap and an external source, such as a magnetic attraction force, imposes a torque on the flaps, rotating the flaps out of a horizontal plane, i.e., parallel to the substrate 202. The same force may also be used to impose a translational force on the flaps, sliding them along the substrate 202.

Each locking flap 206 preferably also includes alignment guides 226 for engaging with side edges 228 of the main flap 204 during the assembly of the 3D structure. The alignment guides 226 are preferably centered on the hinge axis 210, so that displacement along the Y-axis 222 between a contact point of the locking flap 206 and the main flap 204 with respect to the axis 210 is eliminated. As a result, no angular misalignment is generated. In addition, each alignment guide 226 is preferably shaped to force the main flap 204 into a vertical position during assembly, as described below in relation to FIGS. 3A–3F below. The shape of the alignment guides can generally be described as "V" or "U" shaped.

Figure 3A:
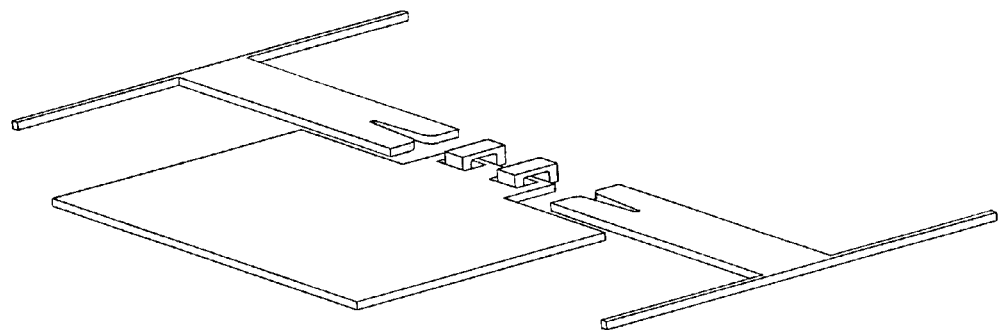
FIGS. 3A to 3F are isometric views of the micro-electromechanical hinged flap system shown in FIG. 2, in different stages of assembly.
Figure 3B:
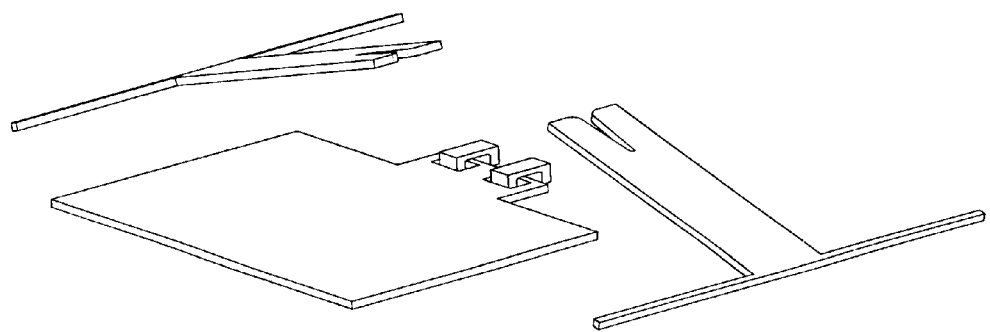
Figure 3C:
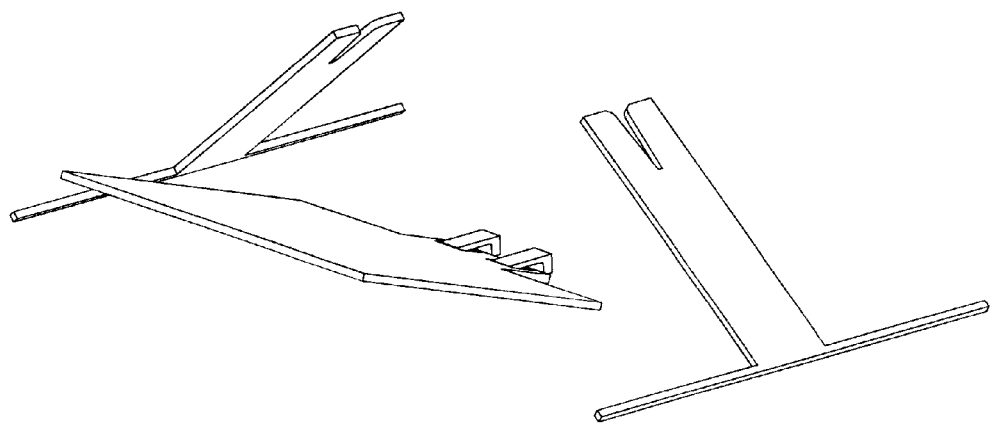
Figure 3D:
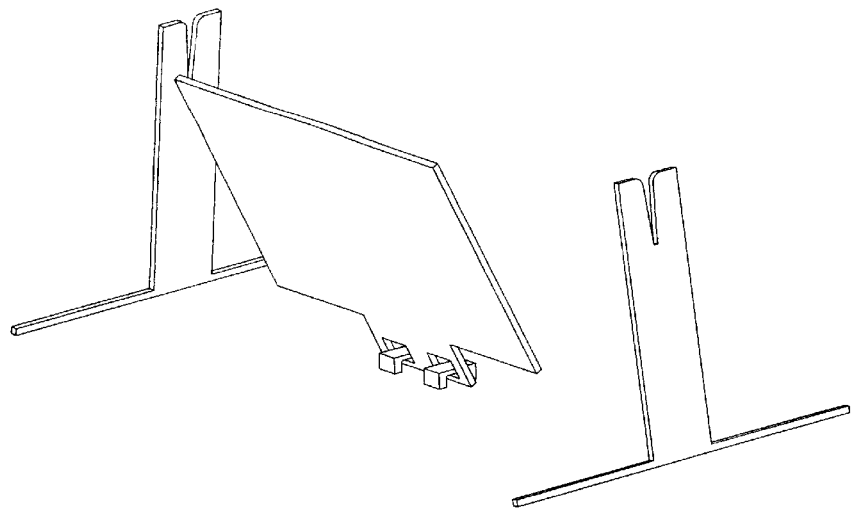
Figure 3E:
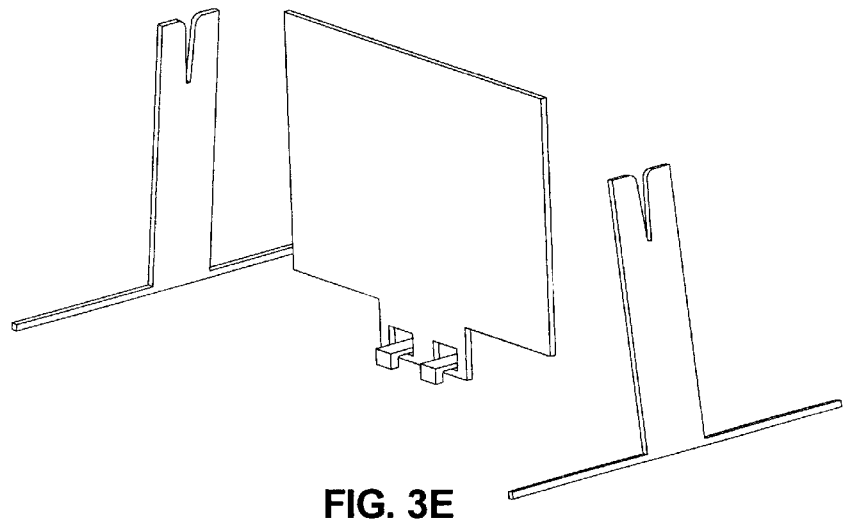
Figure 3F:
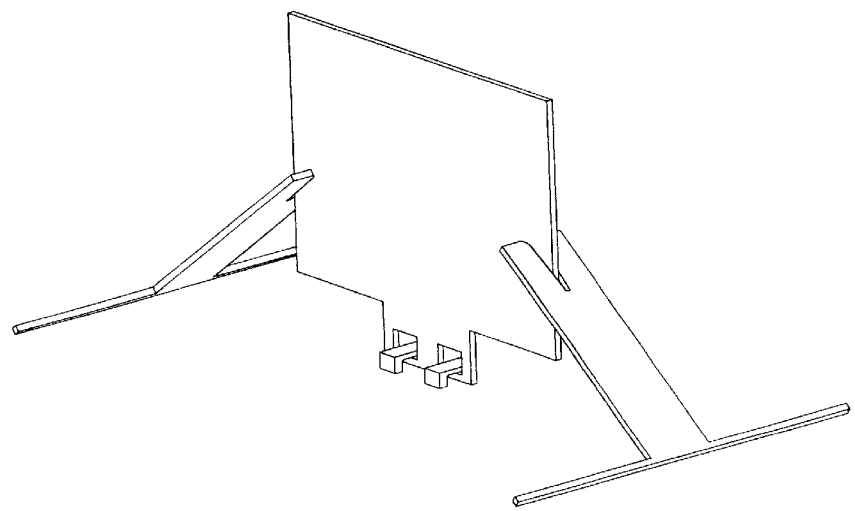

FIGS. 3A to 3F are isometric views of the micro-electromechanical hinged flap system shown in FIG. 2, during various stages of assembly. FIG. 3A shows the micro-electromechanical hinged flap system in its unassembled position. FIG. 3B shows the micro-electromechanical hinged flap system with the locking flaps partially raised. FIG. 3C shows the micro-electromechanical hinged flap system with both the main flap and the locking flaps partially raised. FIG. 3D shows the micro-electromechanical hinged flap system with the locking flaps completely raised and with the main flap partially raised. FIG. 3E shows the micro-electromechanical hinged flap system with the locking flaps and the main flap completely raised. FIG. 3F shows the micro-electromechanical hinged flap system with the main flap completely raised to a desired position and with the locking flaps released so that they engage the main flap to secure the main flap in the desired position. The main flap is preferably raised through approximately ninety degrees to a vertical position, while the locking flaps are preferably rotated through an acute angle.

Accurate positioning of the main flap 204 (FIG. 2) is preferably provided by the alignment guides 226 (FIG. 2).

Once the external forces are removed, the biasing forces cause the locking flaps 206 (FIG. 2) to rotate back toward their horizontal positions. This rotation of the locking flaps toward their original position engages the alignment guides with the edges 228 (FIG. 2) of the main flap and, thereby forces the main flap into the desired position, typically perpendicular to the substrate, i.e., vertical. Therefore, even if the main flap is not perfectly vertical, the "V" shape of each alignment guide forces the main flap into a vertical position and secures the flap in place. This can be seen in FIGS. 3E and 3F after the maximum external force has been applied to each locking flap.

Moreover, the biasing force of each locking flap applies equal and opposite biasing forces to opposite sides of the main flap, preventing lateral motion of the main flap in the X direction 220 (FIG. 2). Also, once fully engaged, the alignment guides 226 (FIG. 2) prevent lateral motion of the main flap in the Y direction 222 (FIG. 2). The locking flaps, therefore, substantially increase the stability of the main flap in its hinges 218 (FIG. 2).

Figure 4:
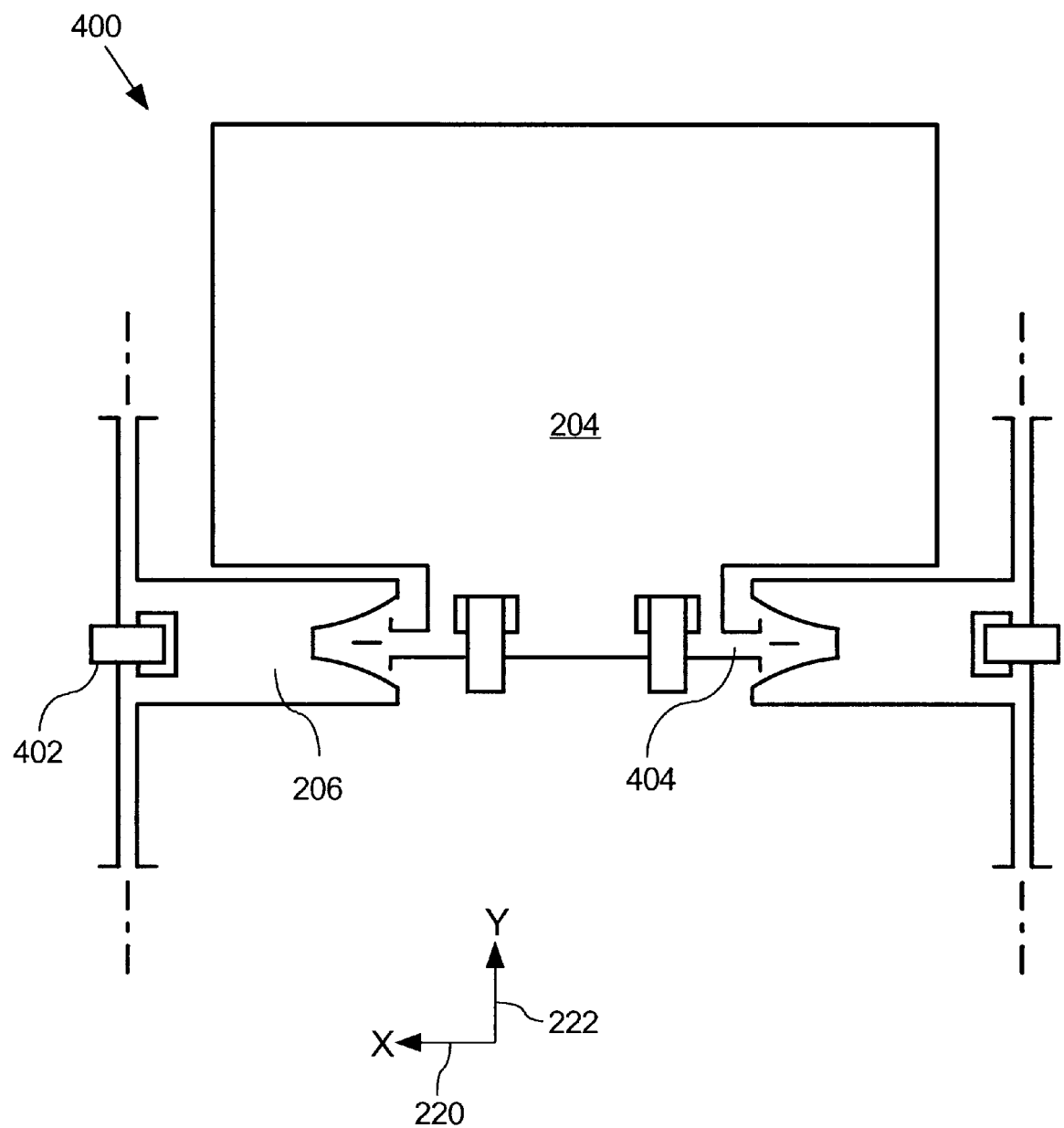
FIG. 4 is a top view of an unassembled micro-electromechanical hinged flap system according to another embodiment of the invention.

FIG. 4 is a top view of an unassembled micro-electromechanical hinged flap system 400 according to another embodiment of the invention. Although various additional components are shown together in this FIGURE, it should be understood that each component may be used on its own or in combination with other components. Each locking flap 206 includes a hinge 402 coupling the locking flap 206 to the substrate 202 (FIG. 2). The hinge 402 may provide further stability in the X direction. The hinge 402 is preferably a staple hinge.

The main flap 204 may also include a main flap biasing mechanism 404, such as a torsion bar, to retain the main flap in the unassembled position before manufacture, and to provide further stability in the X and Y directions.

Figure 5:
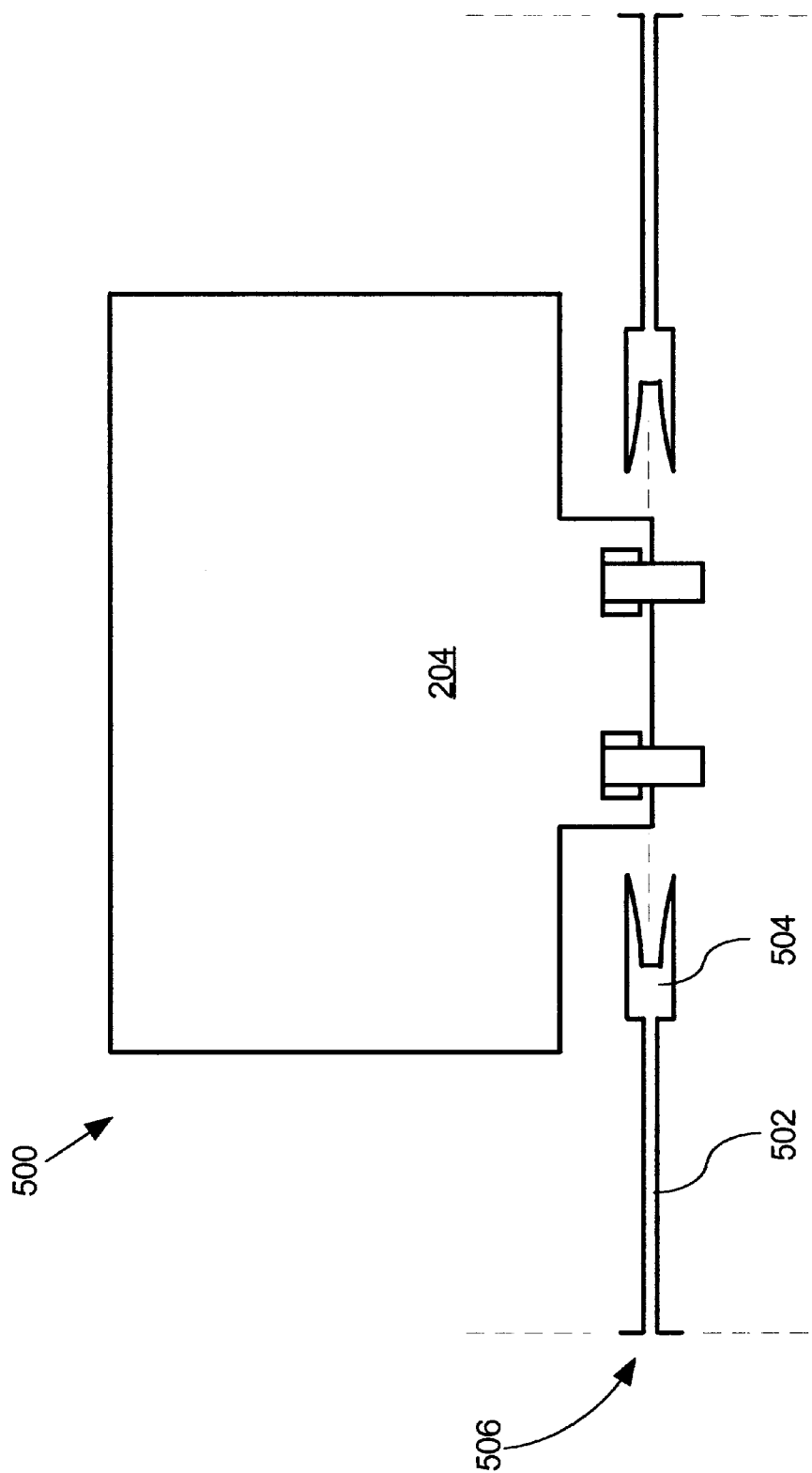
FIG. 5 is top view of an unassembled micro-electromechanical hinged flap system according to yet another embodiment of the invention.

FIG. 5 is a top view of an unassembled micro-electromechanical hinged flap system 500 according to yet another embodiment of the invention. In this embodiment, the locking flaps 504 include another type of biasing mechanism, namely a bending mode spring 502, such as a cantilevered arm. The bending mode spring 502 is preferably a projecting beam, that is coupled to the substrate 202 (FIG. 2) at a first end 506 thereof and is coupled to the locking flap 504 at a second end thereof. The thickness and length of the bending mode spring 502 is chosen to supply a desired biasing force on the locking flap 504. Other considerations include limiting the length of the bending mode spring to maintain a compact structure. The bending mode spring 502 provides a spring force to bias the locking flap in its unassembled position, i.e., the horizontal position shown. In use, the locking flap is bent upward toward the vertical and thereafter released once the main flap 204 has been positioned, thereby, engaging with the main flap 204 to secure it into position.

Figure 6:
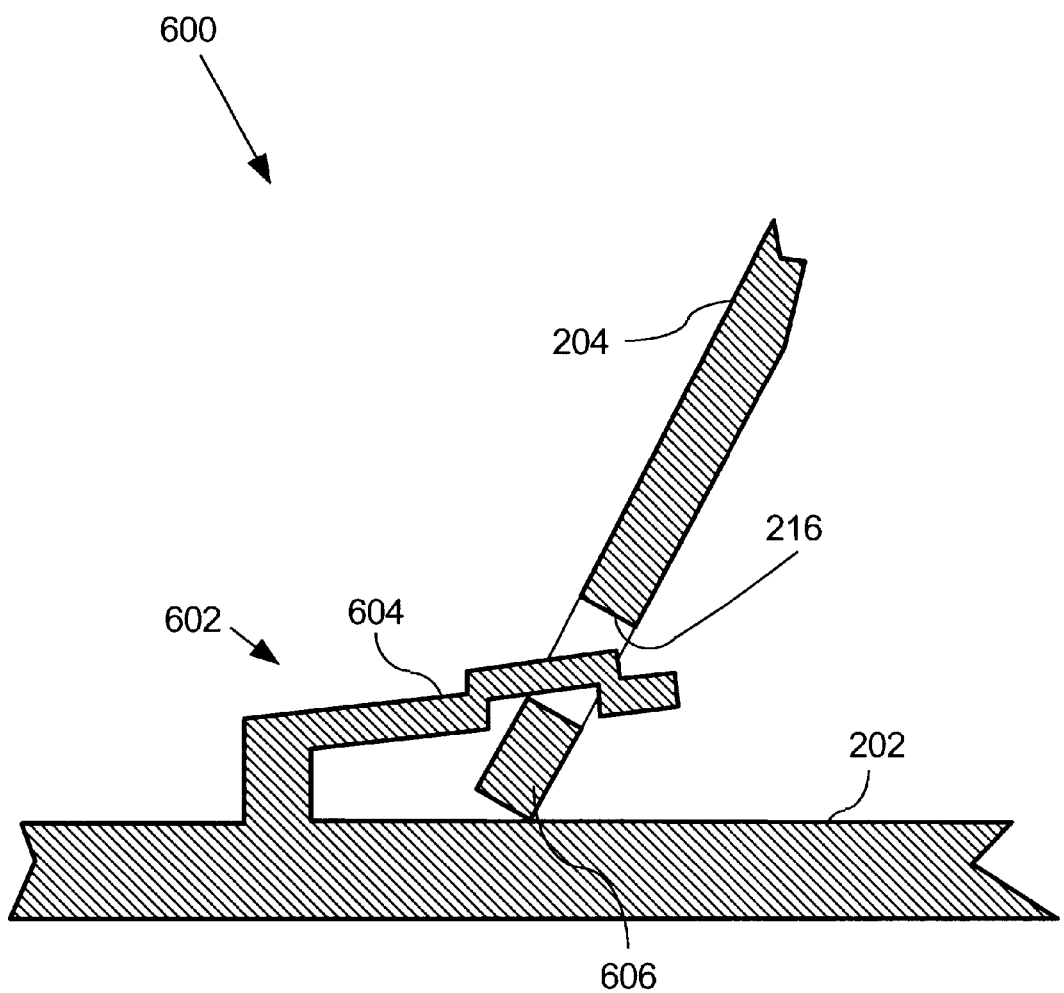
FIG. 6 is a partial cross-sectional view of a scissor hinge system according to an embodiment of the invention.

FIG. 6 is a partial cross-sectional view of a scissor hinge system 600 according to yet another embodiment of the invention. In this embodiment, the main flap 204 is secured to the substrate 202 by means of a scissor hinge 602. The scissor hinge 602 comprises a cantilever beam 604 that passes through the openings 216 near one side of the main flap 204. A portion of the main flap under the cantilever beam 604 acts as a shaft 606. As mentioned above, due to the nature of MEMS manufacturing such shafts 606 are typically square or rectangular in cross section.

In the absence of an external force, the main flap 204 lies in a horizontal, relaxed, and unassembled position on or near the substrate 202. However, when a sufficient external force, such as a magnetic field, is applied to the system, the main flap 204 is raised as shown in FIGS. 3A to 3F. When the shaft 606 engages the cantilever beam 604, the cantilever beam 604 bends away from the substrate 202 while applying a downward force on the shaft 606, effectively pinching the shaft between the cantilever beam 604 and the substrate 202. Once the main flap 204 has been fully rotated into a position substantially perpendicular to the substrate, the hinge either applies no, or little force against the shaft 606. Further rotation of the main flap would necessitate again applying an external force to the main flap 204. In this way, the scissor hinge provides some means for temporarily fixing the main flap in the vertical position. In a similar manner, a scissor hinge may be used in combination with a locking flap 206, as shown and described in relation to FIG. 4.

Figure 7:
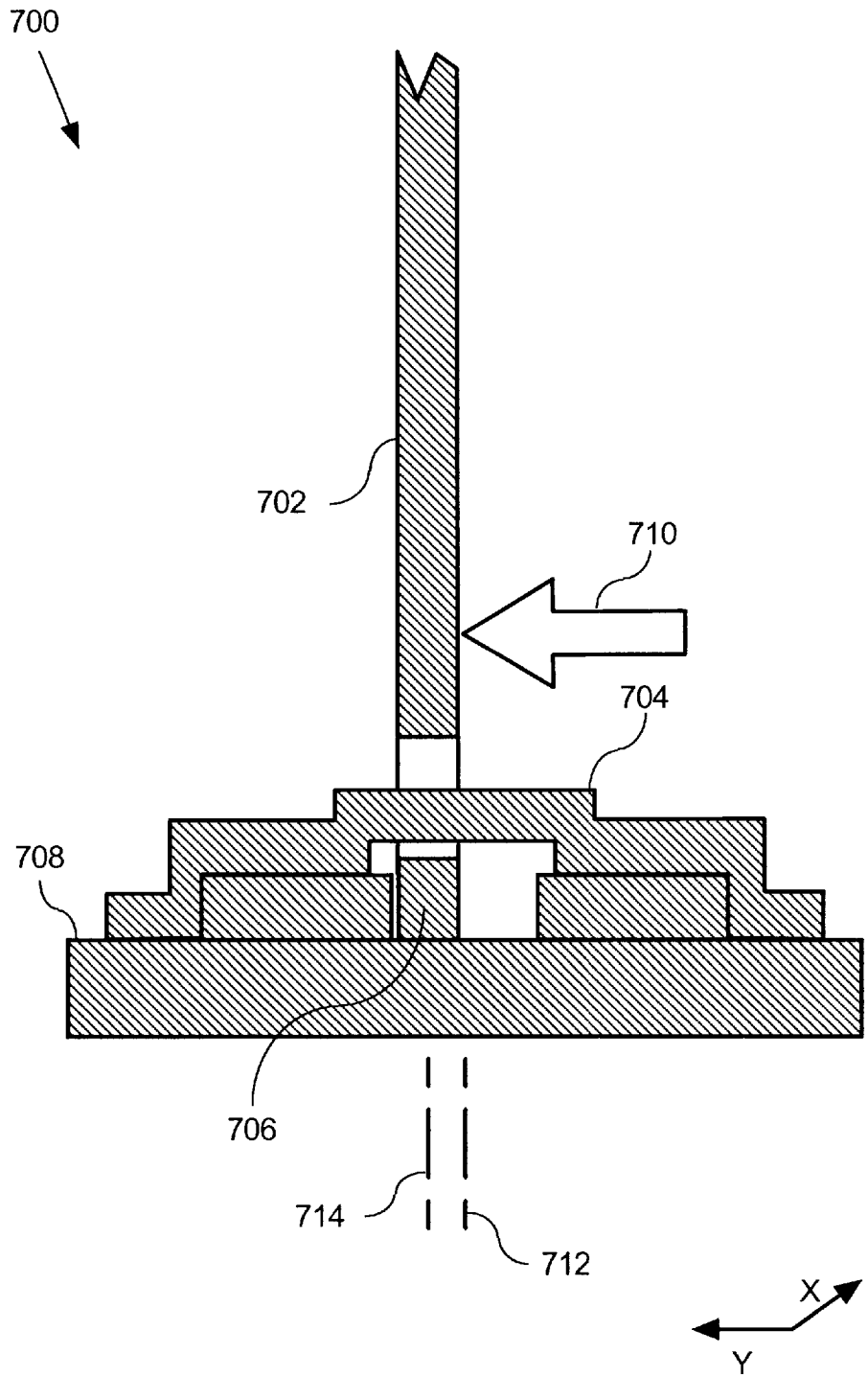
FIG. 7 is a partial cross-sectional view of a system for aligning a main hinge according to another embodiment of the invention.

FIG. 7 is a partial cross-sectional view of a system 700 for aligning a main flap 702 according to yet another embodiment of the invention. A main flap 702 is coupled to a substrate 708 by means of a hinge. The hinge preferably comprises a staple or bending spring 704 coupled to the substrate 708, and a shaft 706 coupled to the main flap 702, such that the shaft can rotate within the hinge, i.e., within the staple or bending spring 704. Typically, the main flap 702 is rotated to a position that is coincident with axis 712. However, it has proven difficult to align the main flap 702 close to axis 712, as the main flap is free to slide along the Y-axis due to the undesirable tolerances that exist in MEMS hinges (described above). For this reason, it is desirable to translate the main flap 702, and its shaft 706, to an extreme position within the hinge, i.e., to move the shaft to one side of the hinge. In this way, raising of the main flap 702 to a position coincident with a new axis 714, is more accurately controlled.

The main flap 702 is typically translated by applying a force 710 to the main flap in a desired translation direction. In a preferred embodiment, this force 710 is applied by an external spring force, such as that generated by another MEMS spring, for example another flap and torsion bar mechanism. Moreover, the center of the locking flaps 206 (FIG. 2), more particularly the center of the alignment guides 226, are now positioned to accurately coincide with the new axis 714.

Figure 8:
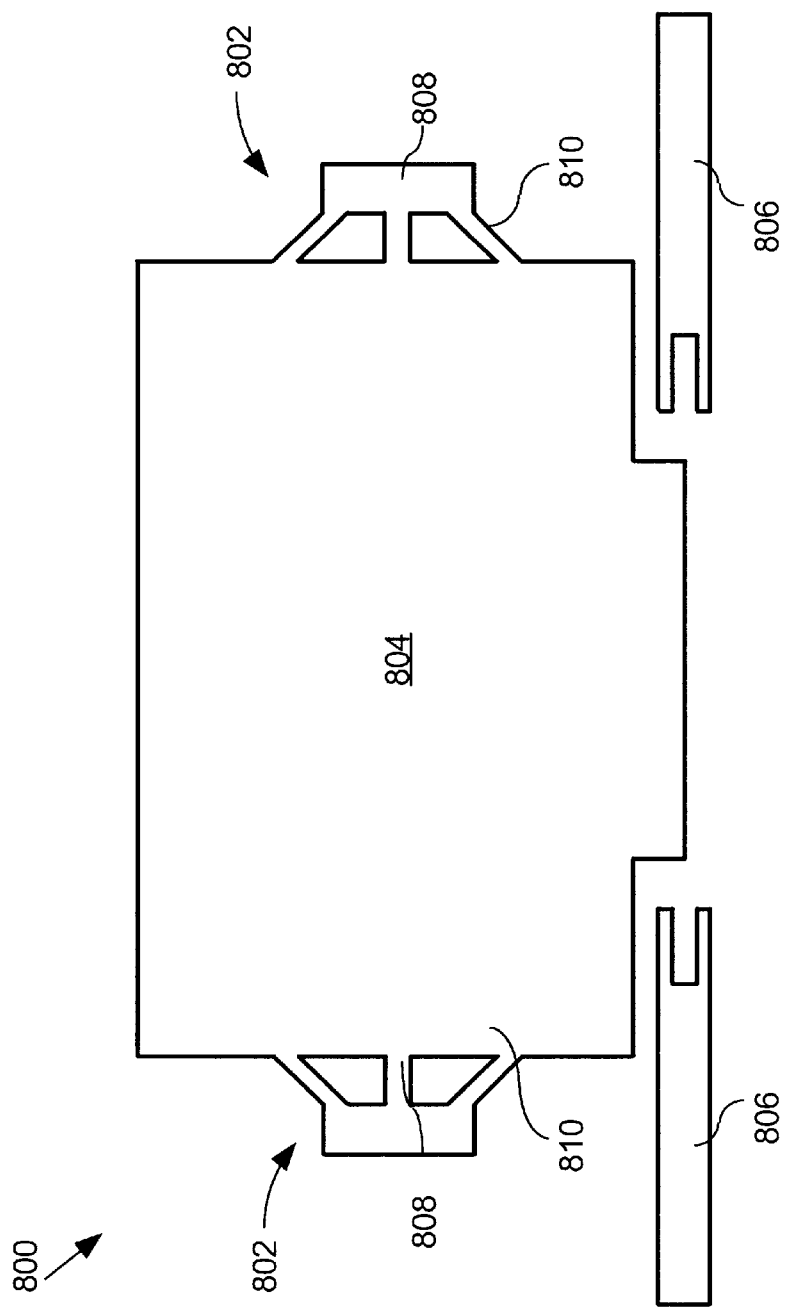
FIG. 8 is a top view of an unassembled micro-electromechanical hinged flap system showing stress-relieving mechanisms according to another embodiment of the invention.

FIG. 8 is a top view of an unassembled microelectromechanical hinged flap system 800 showing stress-relieving mechanisms 802 according to another embodiment of the invention. The stress-relieving mechanisms 802 are coupled to a main flap 804 to ensure that the main flap 804 is not deformed by biasing forces directed at the main flap 804 by locking flaps 806 when the micro-electromechanical hinged flap system 800 is in its assembled position. Each stress-relieving mechanism 802 preferably includes a landing surface 808 for each respective locking flap 806 to engage with, and a simple truss structure 810 to more evenly distribute the biasing force directed at the main flap 804. The stress-relieving mechanisms 802, therefore, distribute stress/force on the main flap 804 from a point-load to several, smaller forces along opposing sides of each main flap. This helps maintain the flatness of the main flap, i.e., the main flap, although being very thin, does not warp. Moreover, the simple truss structure 810 can also absorb some deformation energy applied by the biasing force through deformation or/and twist of each truss of the simple truss structure 810.

Figure 9:
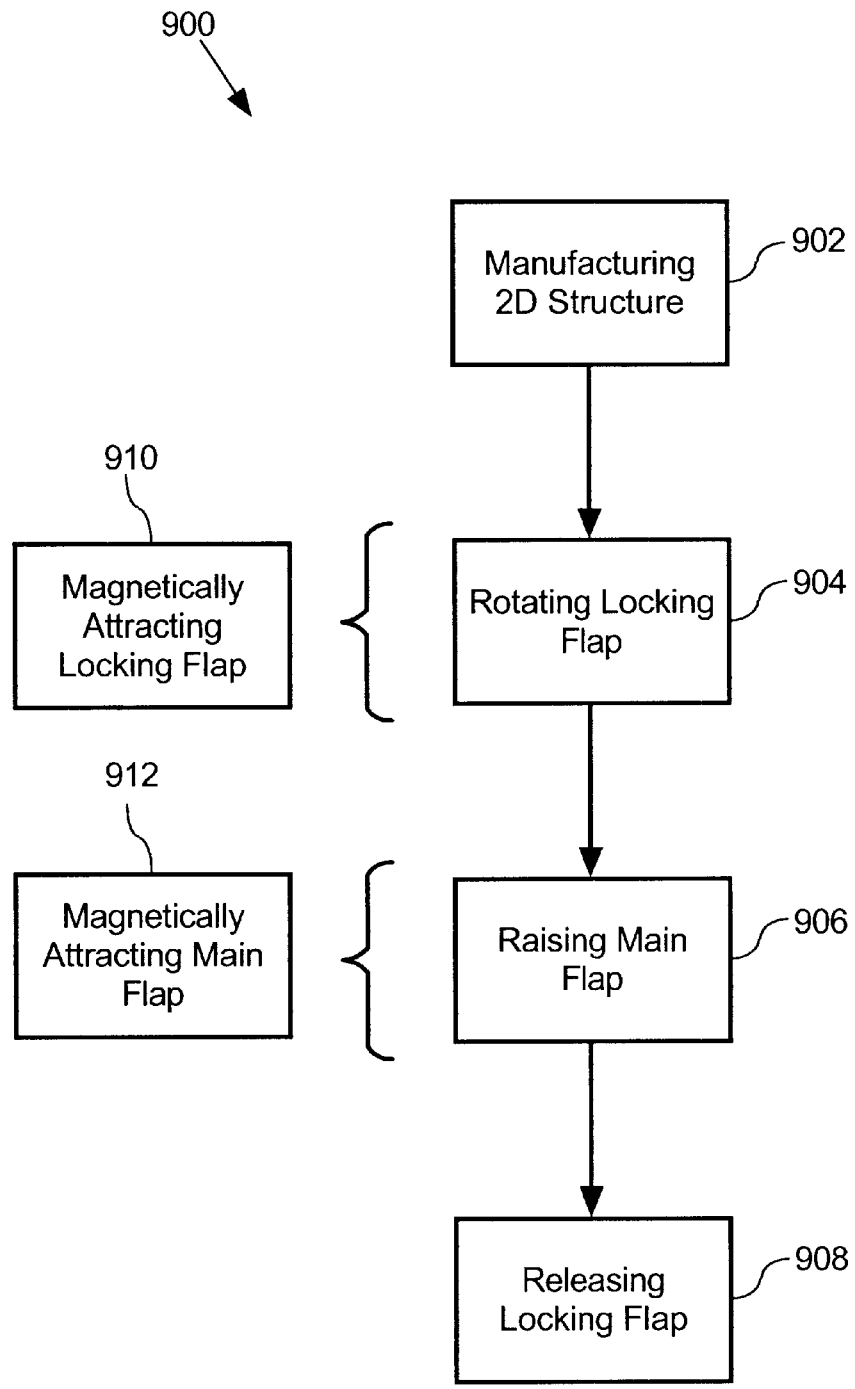
FIG. 9 is flow chart of a method for assembling a micro-electromechanical hinged flap system according to an embodiment of the invention.

FIG. 9 is flow chart of a method 900 for assembling a micro-electromechanical hinged flap system according to an embodiment of the invention. Firstly, a two-dimensional structure is manufactured 902, preferably by known photo-lithography and etching processes. The locking flap 206 (FIG. 2) is then rotated 904 through an acute angle against a biasing force caused by the biasing mechanism 208 (FIG. 2) or 502 (FIG. 5) coupling the locking flap to the substrate 202 (FIG. 2). Additionally, the locking flap is preferably rotated 904 to a position that will not block the rotation of the main flap 204 (FIG. 2). The main flap is then raised 906, preferably by rotating it through approximately ninety degrees. Finally, the locking flap is released 908, such that the biasing force causes the locking flap to engage with the main flap, thereby, securing the main flap in a substantially vertical position.

The method may further comprise rotating an additional locking flap through an acute angle against a biasing force caused by an additional biasing mechanism coupling the additional locking flap to the substrate. The rotation of the additional locking flap preferably occurs simultaneously with the rotation of the locking flap. Releasing the locking flap and the additional flap cause the locking flap and the additional locking flap to engage with the main flap on either side thereof, thereby, securing the main flap in position between equal and opposite biasing forces.

The rotation 904 of the locking flap is preferably accomplished by magnetically attracting 912 the locking flap to a magnetic source. Likewise, the raising 906 of the main flap is preferably accomplished by magnetically attracting 910 the main flap to a magnetic source. These attractive forces are preferably generated between the tabs and the magnetic source.

Furthermore, if spring-loaded structures, such as scissor hinges 602 (FIG. 6), are used, the raising step 906 and/or the rotating step 904 overcome a biasing force caused by the spring-loaded structure.

In addition, if the embodiment shown and described in FIG. 7 is used, an additional step of translating the main flap in a direction parallel to the substrate is undertaken. Translation of the main flap occurs by applying the force 710 (FIG. 7) to the main flap in a desired translation direction. In a preferred embodiment the force is applied by an external spring force, such as that generated by another MEMS spring.

To summarize, the above described self-assembly method starts with an unassembled and relaxed 2D system that mechanically responds to an external source, such as a magnetic field or a change in temperature. The externally applied forces induce torque forces on the main and locking flaps, rotating all the flaps to the desired positions and angles. Once the main flap is in position, the locking flaps are released to hold the main flap in position after the external source is removed. This self-assembly process can be used in batch assembly or individual assembly for creating 3D structures on a chip or wafer. Once the systems are assembled by this process, they can maintain their positions or angles permanently, or they can be disassembled to their original 2D form. Although disassembling the system is possible, it is not as easy as assembling the system, thereby having the advantage of providing a robust system having a high reliability in the field. Disassembly may be manual or automatic. To disassemble manually, microprobes may be used to pull back each locking flap and force the main flap into a horizontal position. To disassemble via external forces, a vertical field is applied to raise the locking flaps and a horizontal field is applied simultaneously to force the main flap away from its vertical position held by a spring-loaded structure, such as a scissor hinge.

In a preferred embodiment, a single magnetic field is applied to the system. Because locking flaps preferably include more permalloy than the main flap does, the locking flaps start rising first, but are only partially raised when the main flap starts its ascent. This can be seen in FIG. 3A–3F. It should be further appreciated that the sequence of raising the flaps is not essential, as long as the locking flaps are first raised out of the path of the ascending main flap.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Furthermore, the order of steps in the method are not necessarily intended to occur in the sequence laid out. It is intended that the scope of the invention be defined by the following claims and their equivalents.

Bibliography
1. See: L. Fan, M. C. Wu, K. D. Choquette, and M. H. Crawford, Self-assembled microactuated XYZ stages for optical scanning and alignment, Vol. 1, 319–322 (Proc. Int. Conf. Solid-State Sensors and Actuators, Chicago, Ill., 1997); N. C. Tien, O. Solgaard, M. H. Kiang, M. Daneman, K. Y. Lau, and R. S. Muller, Surface micromachined mirrors for laser-beam positioning, Sens. Actuators, Vol. A52, 76–80 (1996); or Y. Fukuta, D. Collard, T. Akiyama, E. H. Yang, and H. Fujita, Micro-actuated self-assembling of 3D polysilicon structures with reshaping technology, IEEE MEMS, 477–481 (1997).
2. See: C. Liu, T. Taso, Y. C. Tai, and C. M. Ho, Surface micromachined magnetic actuators, Proc. IEEE Workshop on Micro Electromechanical Systems, 57–62 (1994); J. Judy and R. S. Muller, Magnetically actuated, addressable microstructures, IEEE J. Microelectromech. Syst., Vol. 6, No. 3, 249–256, (1997); or Y. W. Yi and C. Liu, Magnetic actuation of hinged microstructures, IEEE J. Microelectromech. Syst., Vol. 8, No. 1, 10–17, (1999).
3. See: I. Shimoyama, O. Kano, and H. Miura, 3D microstructures folded by Lorentz force, Proc. 11th Int. Workshop MicroElectroMechanical Systems, Heidelberg, Germany, Jan. 25–29, 24–28 (1998).
4. See: J. H. Comtois and V. M. Bright, Surface micromachined polysilicon thermal actuator arrays and application, Solid-State Sensor and Actuator Workshop, Hilton Head, S.C., June 2–6, 174–177 (1996); or J. R. Reid, V. M. Bright, and J. H. Comtois, Automated assembly of flip-up micromirrors, in Proc. 1997 Int. Conf. Solid-State Sensors and Actuators, Chicago, Ill., Vol. 1, 292–298.
5. See: E. J. Garcia, "Micro-flex mirror and instability actuation technique," in Proc. 11th Int. Workshop MicroElectroMechanical Systems, Heidelberg, Germany, Jan. 25–29, 470–475 (1998).
6. See: K. F. Harsh, R. S. Irwin, and Y. C. Lee, Solder self-assembly for MEMS, in Proc. 4th Instrumentation Symp., Reno, Nev., May 3–7, 256–261 (1998).
7. See: T. Ebefors, E. Kalvesten, and G. Stemme, New small radius joints based on thermal shrinkage of polyimide in V-grooves for robust self-assembly 3D microstructures, J. Micromech. Microeng., Vol. 8, 188–194 (1988); E. Smela, O. L. Inganas, and I. Lundstrom, Self-opening and closing boxes and other micromachined folding structures, in Proc. 8th Int. Conf. on Solid-State Sensors and Actuators, Stockholm, Sweden, June 25–29, 350–351 (1995); E. Smela, O. L. Inganas, and I. Lundstrom, Controlled folding of micrometer size microstructures, Science, Vol. 268, 1735–1738 (1995); R. R. A. Syms and E. M. Yeatman, Self-assembly of fully three-dimensional microstructures using rotation by surface tension forces, Electron. Letter, Vol. 29, 662–664 (1993); or R. R. A. Syms, Surface tension powered self-assembly of 3-D micro-optomechanical structures, IEEE J. Microelectromech. Syst., Vol. 8, No. 1, 448–455 (1999).

What is claimed is:

1. A micro-electromechanical hinged flap system comprising:
   a substantially horizontal substrate;
   a main flap hinged on one side thereof to said substrate; and
   at least one locking flap for securing said main flap in a substantially vertical position, where said locking flap is coupled to said substrate by means of a biasing mechanism that continually forces said locking flap toward a position parallel to said substrate.

2. The micro-electromechanical hinged flap system of claim 1, wherein said biasing mechanism comprises at least one locking flap torsion bar coupled on a side thereof to said locking flap, and coupled on another side thereof to said substrate.

3. The micro-electromechanical hinged flap system of claim 1, wherein said biasing mechanism comprises a bending mode spring coupled on a side thereof to said locking flap, and coupled on another side thereof to said substrate.

4. The micro-electromechanical hinged flap system of claim 1, wherein said biasing mechanism comprises:
   at least one locking flap torsion bar coupled on a side thereof to said locking flap, and coupled on another side thereof to said substrate; and
   a bending mode spring coupled on a side thereof to said locking flap, and coupled on another side thereof to said substrate.

5. The micro-electromechanical hinged flap system of claim 1, further comprising an additional locking flap coupled to said substrate, where said additional locking flap is disposed n ear an opposing side of said main flap to where said locking flap is disposed.

6. The micro-electromechanical hinged flap system of claim 1, wherein said main flap is hinged to said substrate along a hinge axis that is substantially perpendicular to a rotational axis of said locking flap.

7. The micro-electromechanical hinged flap system of claim 1, wherein said main flap is hinged to said substrate by means of multiple hinges.

8. The micro-electromechanical hinged flap system of claim 7, wherein said multiple hinges are spring-loaded structures.

9. The micro-electromechanical hinged flap system of claim 1, wherein said main flap is additionally coupled to said substrate by means of an additional torsion bar.

10. The micro-electromechanical hinged flap system of claim 1, wherein said locking flap is additionally coupled to said substrate by means of an additional hinge.

11. The micro-electromechanical hinged flap system of claim 10, wherein said additional hinge is a staple hinge.

12. The micro-electromechanical hinged flap system of claim 1, wherein said main flap and said locking flap also include a ferrous metal tab configured to attract a magnetic source.

13. The micro-electromechanical hinged flap system of claim 1, wherein said main flap includes a stress relieving mechanism that distributes a biasing force directed at said main flap from said locking flap.

14. A method for assembling a micro-electromechanical hinged flap system, comprising:
   rotating a locking flap through an acute angle against a biasing force caused by a biasing mechanism coupling said locking flap to a substrate;
   raising a main flap;
   releasing said locking flap, such that said biasing force causes said locking flap to engage with said main flap, thereby, securing said main flap in position at a predetermined angle.

15. The method of claim 14, wherein said rotating further comprises rotating an additional locking flap through an acute angle against a biasing force caused by an additional biasing mechanism coupling said additional locking flap to said substrate.

16. The method of claim 15, wherein said releasing further comprises releasing said locking flap and said additional flap, such that said biasing forces cause said locking flap and said additional locking flap to engage with said main flap on opposing sides thereof, thereby, securing said main flap in position between equal and opposite biasing forces.

17. The method of claim 14, wherein said raising comprises raising said main flap through approximately ninety degrees.

18. The method of claim 14, further comprising initially manufacturing said locking flap, substrate, and main flap using micro-electromechanical systems (MEMS) technology.

19. The method of claim 14, wherein said rotating is accomplished by magnetically attracting said locking flap to a magnetic source.

20. The method of claim 14, wherein said raising is accomplished by magnetically attracting said main flap to a magnetic source.

21. The method of claim 14, wherein said rotating overcomes a biasing force caused by a torsion bar that couples said locking flap to said substrate.

22. The method of claim 14, wherein said rotating overcomes a biasing force caused by a bending mode spring that couples said locking flap to said substrate.

23. The method of claim 14, wherein said raising overcomes a biasing force caused by a spring-loaded structure that couples said main flap to said substrate.

24. The method of claim 14, wherein said raising overcomes a biasing force caused by a main flap torsion bar that couples said main flap to said substrate.

25. The method of claim 14, further comprising translating said main flap along a direction parallel to said substrate in a direction normal to said main flap.

26. The method of claim 25, wherein said translating step is caused by a micro-electromechanical system (MEMS) spring.

* * * * *